(12) United States Patent
Masselink et al.

(10) Patent No.: US 7,848,376 B2
(45) Date of Patent: Dec. 7, 2010

(54) QUANTUM CASCADE LASER STRUCTURE (75) Inventors: William Ted Masselink, Berlin (DE); Sebastian Dressler, Berlin (DE); Mykhaylo Petrovych Semtsiv, Berlin (DE); Nikolai Georgiev, Dresden (DE); Manfred Helm, Dresden (DE); Thomas Dekorsy, Grosserkmannsdorf (DE); Mathias Ziegler, Berlin (DE)

(73) Assignees: Humboldt-Universtaet Zu Berlin, Berlin (DE); Forschungszentrum Rossendorf e.V., Dresden (DE)

( * ) Notice: Subject to any disclaimer, the term of this patent is extended or adjusted under 35 U.S.C. 154(b) by 48 days.

(21) Appl. No.: 12/171,169

(22) Filed: Jul. 10, 2008

(65) Prior Publication Data

US 2009/0034570 A1     Feb. 5, 2009

Related U.S. Application Data

(63) Continuation of application No. 11/061,726, filed on Feb. 22, 2005, now abandoned.

(30) Foreign Application Priority Data

Feb. 20, 2004    (DE)                 10 2004 009 531

(51) Int. Cl.
     *H01S 5/00*         (2006.01)
(52) U.S. Cl. ............................. 372/45.011; 372/43.01; 372/44.01; 372/45.012
(58) Field of Classification Search ............ 372/45.011, 372/45.01, 44.01, 45.012
See application file for complete search history.

(56) References Cited

U.S. PATENT DOCUMENTS

| | | | | |
|---|---|---|---|---|
| 4,999,844 A | * | 3/1991 | Imamoto | 372/45.012 |
| 6,023,482 A | * | 2/2000 | Capasso et al. | 372/45.01 |
| 6,232,624 B1 | * | 5/2001 | Matloubian et al. | 257/194 |
| 6,324,199 B1 | * | 11/2001 | Capasso et al. | 372/45.01 |
| 7,558,305 B2 | * | 7/2009 | Botez et al. | 372/43.01 |

* cited by examiner

*Primary Examiner*—Minsun Harvey
*Assistant Examiner*—Patrick Stafford
(74) *Attorney, Agent, or Firm*—Rothwell, Figg, Ernst & Manbeck, P.C.

(57) ABSTRACT

A quantum cascade laser structure in accordance with the invention comprises a number of cascades (100), each of which comprises a number of alternately arranged quantum wells (110a to 110j) and barrier layers (105 to 105j). The material of at least one quantum well (110a to 110j) as well as the material of at least one barrier layer (105 to 105j) is under mechanical strain, with the respective strain being either a tensile strain or a compression strain. The quantum wells (110a to 110j) and barrier layers (105 to 105j) are engineered in the quantum cascade laser structure in accordance with the invention so that existing strains are largely compensated within a cascade (100). In the quantum cascade laser structure in accordance with the invention, each material of the quantum wells (110a to 110j) has only one constituent material and the material of at least one barrier layer (105d, 105e, 105f) has at least two constituent materials (111a, 111b, 112a, 112b, 113a, 113b).

20 Claims, 8 Drawing Sheets

QUANTUM CASCADE LASER STRUCTURE

CROSS REFERENCE TO RELATED APPLICATIONS

This application is a continuation of U.S. patent application Ser. No. 11/061,726, filed on Feb. 22, 2005, which claims priority under 35 U.S.C. §119 based on German Application No. 102004009531.0 filed Feb. 20, 2004, which is incorporated herein in its entirety.

The present invention relates to a quantum cascade laser structure, especially a quantum cascade laser structure that enables the production of quantum cascade lasers on the basis of intersubband transitions which can emit laser radiation with a wavelength of about 4 µm at room temperature (approx. 300 K). The invention furthermore relates to a quantum cascade laser (QCL).

The presence and the concentration of a number of molecules, such as $CO_2$, can be detected by measuring the absorption of infrared radiation with wavelength of approx. 4 µm. Furthermore, the atmosphere is permeable for radiation in a wave length spectrum of 2.9 µm to 5.3 µm. In particular it is possible to detect and define the concentration of a number of air-polluting gases, industrial chemicals, and biological emission relevant for medical diagnoses in this way. However, measuring the absorption spectra requires intensive sources of radiation, such as a laser emitting in the suitable wave length spectrum, as well as suitable detectors.

There are several classes of lasers that are capable of emitting radiation in the appropriate wavelength spectrum. A first class of lasers is the so-called lead-salt lasers, which, however, require cooling to a low temperature in their operation. A second class is the so-called antimonide diode laser, which also require cooling to a low temperature, and for which it has not been proven to date that they can emit radiation in the wave length spectrum around approximately 4 µm. A third class of lasers is the so-called "Class-B lasers" such as OPOs (Optic Parametric Oscillator) and DFG laser (Difference Frequency Generation Laser), which are both based on a frequency conversion of laser radiation emitted in the near infrared range by means of non-linear generation of difference energies. However, the optical components required in Class B lasers require a much higher effort and are more expensive than the optical components of lasers that emit the laser radiation directly in the suitable wave length spectrum.

An attractive alternative to the aforementioned lasers is the quantum cascade laser. A quantum cascade laser (QCL) comprises as a core component a number of so-called cascades, each of which has a number of quantum wells and a number of barrier layers, which are arranged alternately and are comprised of semiconductor materials. Typically, a quantum cascade laser comprises approximately 20 to 100 of these cascades. The principle structure of a quantum cascade laser is described, for example, in the article by J. Faist et al., *Science*, Vol. 264, 22 Apr. 1994. An overview of various approaches for quantum cascade lasers is found in J. Faist et al., *IEEE Journal of Quantum Electronics*, Vol. 38, No. 6, July 2002.

For a better comprehension of the structure and the mode of operation of quantum cascade lasers, some of the properties of semiconductor materials are described briefly in the following.

The electrical behavior of a semiconductor material can be described with the so-called band model, which states that various energy ranges, the so-called energy bands, are available to the electrons of the semiconductor material, and that the electrons of the semiconductor material can essentially take on any energy value within said energy bands. Various bands may be separated from one another by a band gap, i.e., an energy band with energy values the electrons cannot possess. If an electron changes from a higher energy band to an energy band in a lower energy range, energy corresponding to the difference of the energy values of the electron before and after the change, which is also called "transition", is released. The energy difference can be released in form of photons. The band with the highest energy level, which is fully filled with electrons at a temperature of 0 Kelvin, i.e., the so-called valence band, and the conduction band that is energetically above the valence band, which is unfilled at 0 Kelvin, as well as the band gap between them are of special significance for a semiconductor material.

In the cascades of quantum cascade lasers, the semiconductor materials for the barrier layers and the quantum wells are selected such that the lower conduction band edge of the barrier material lies higher in energy than the lower conduction band edge of the quantum well material. The lower conduction band edge represents the lowest energy value that an electron can assume within the conduction band. The energy difference between the energy of the lower conduction band edge of the barrier material and the lower conduction band edge of the quantum well material is also called the conduction band discontinuity. As a result of this selection, the electrons of the quantum wells cannot readily penetrate the barrier layers and are therefore enclosed in the quantum wells. The can only "tunnel" through a barrier layer into an adjacent quantum well in a quantum-mechanical process, with the probability of the occurrence of a tunneling process depending on the height of the conduction band discontinuity and the thickness of the barrier layer between the two quantum wells.

In the quantum well, the behavior of the electrons enclosed in said well are determined by quantum mechanics effects due to the small thickness of the layer (only a few nanometers). An essential effect is that the electrons in an energy band of the quantum well can no longer assume any energy value within the energy range of the band, but rather are confined to the energy values of specific energy levels, i.e., so-called sub-bands. The energetic differences between the individual sub-bands are particularly high if the quantum well is very thin and the conduction band discontinuity is high. The electron energy does not change continuously, but rather jumps from one sub-band to the next. The electron can change from one energy level to the other energy level only if the energy increase or the energy decrease suffered by an electron corresponds precisely to the difference of the energy values of two sub-bands. Transitions from one energy level to another energy level within one and the same band are called inter-subband transitions. In the cascades of the quantum cascade laser, the emission of laser radiation occurs at these intersubband transitions.

J. Faist et al., *IEEE Journal of Quantum Electronics*, Vol. 38, No. 6, July 2002, describes a quantum cascade laser that can emit laser radiation with a wave length of 5.3 µm at room temperature. The cascades of the quantum cascade laser described in the aforementioned article are applied to an InP (indium phosphide) substrate. Its quantum wells are comprised of $In_{0.6}Ga_{0.4}As$ (indium-gallium-arsenide with 60% indium and 40% gallium) and its barrier layers are comprised of $In_{0.44}Al_{0.56}As$ (indium-aluminum-arsenide with 44% indium and 56% gallium). Because of the ratio between the indium and gallium composition in the quantum wells and/or the ratios between the indium and aluminum composition in the barrier layers, the materials of said layers, all of which have a crystalline structure, have other lattice constants than the InP substrate (the lattice constant can be considered as a measure of how far the atoms in a crystalline material, where atoms are essentially arranged at the junctions of an intended lattice, are distanced from one another). When preparing a layer structure for the cascades of the quantum cascade laser, the layers will adapt to InP substrate, taking on its planar constant in the plane parallel to the surface, which leads to strain due to the different lattice constants. Thus, the adaptation can be maintained only up to a specific critical thickness of the layer structure if the strain is not compensated. To compensate for the strain created in the layers within one cascade, the parts of the constituents in the $In_{0.6}Ga_{0.4}As$ quantum wells are selected so that compression strain is created in said layers, whereas the parts of the constituents in the $In_{0.44}Al_{0.56}As$ barrier layers are selected so that tensile strain is created in said layers. Furthermore, the thicknesses of the individual layers are coordinated with respect to one another so that the compression- and the tensile strains are largely compensated within a cascade (so-called strain compensation).

Although it was possible to emit laser radiation in a wave length spectrum of 3.5 to 100 μm with intersubband transitions in quantum cascade lasers, it was not possible to date to achieve an emission of radiation in the wave length spectrum below 4.6 μm at room temperature.

The problem to be solved by the present invention is to provide a quantum cascade laser structure with intersubband transitions that allow the production of quantum cascade lasers which can emit radiation in the wave length spectrum of 2.9-5.3 μm, especially in a spectrum of 3.1 to 4.6 μm, at room temperature, i.e., at approximately 300 K.

Another object to be attained by the invention is to provide an improved quantum cascade laser.

The first object of the invention is attained with a quantum cascade laser structure in accordance with Claim 1 and the second object is attained with a quantum cascade laser in accordance with Claim 15. The dependent claims include advantageous modifications of the invention.

The quantum cascade laser structure in accordance with the invention comprises a number of cascades, i.e., at least two cascades and preferably 20 to 50 cascades, each of which comprise a number of alternately arranged quantum wells and barrier layers. The material of at least one quantum well as well as the material of at least one barrier layer are under mechanical strain, with the respective strains in particular may being tensile strains or compression strains. The quantum wells and barrier layers are coordinated such in the quantum cascade laser structure in accordance with the invention that any strain is largely compensated within one cascade. Largely compensated should be understood to mean that the compensation does not necessarily need to be complete, but only to such an extent that there is no strain that would make pseudo-morphological growth impossible. One skilled in the art understands pseudo-morphological growth to be a growth where an adsorbed crystalline layer having a different crystalline structure and/or a different lattice constant than the substrate accepts the crystalline structure and the lattice constant of the substrate. In the quantum cascade laser structure in accordance with the invention, the material of the quantum wells has only one respective constituent material and the material of at least one of the barrier layers has at least two constituents materials, with the two constituent materials may having different constituents or the same constituents in various quantity ratios. The constituent materials of a layer may comprise, for example, the elements Al (aluminum), Ga (gallium), As (Arsenic) or In (Indium) as constituents. In the following, the term constituent material is used for materials having only one constituent material synonymously for the material of the respective layers.

Compared to the quantum cascade laser structures with strain compensation, as described in the state of the art, the quantum cascade laser structure in accordance with the invention is more flexible in the adjustment of the band structure, the so-called "band structure engineering." Important parameters in the engineering of the band structure are the size of the conduction band discontinuity, the thickness of the quantum wells and the probability of an electron penetrating the barrier layer, i.e., the so-called tunnel probability. In the strain-compensated quantum cascade laser structures in accordance with the state of the art, the size of the conduction band discontinuity depends on the relative ratios of the constituents in the constituent materials used in the barrier layers and quantum wells. The tunnel probability, however, depends on the size of the conduction band discontinuity, i.e., the relative compositions of the constituents, as well as on the thickness of the barriers. Thus, for the band structure engineering, there are only two largely independently variable parameters available in the strain-compensated quantum cascade laser structures in accordance with the state of the art for engineering the barrier thickness, the conduction band discontinuity and the tunnel probability. If, for example, the relative ratios of the constituents in the constituent materials are used to engineer the conduction band discontinuity, and the thickness of the layers is then adapted for strain compensation, this also already determines the tunnel probability. In particular, it is not possible to simultaneously maximize the conduction band discontinuity and realize a good strain compensation because the tunnel probability is an important parameter for the laser process, i.e., for the emission of the laser radiation.

Furthermore, the quantum cascade laser structure in accordance with the invention also offers the composition of at least one barrier layer with two constituent materials as a variable parameter. For example, it is possible to select one of the constituent materials of said barrier layer such that the size of the conduction band discontinuity is engineered to a desired value—for example maximized—whereas the barrier thickness is selected such that the tunnel probability reaches the desired value for the engineered value of the conduction band discontinuity. The relative ratios of the constituents in the second constituent material of the barrier layer can then be selected so that the strain is compensated by the already determined barrier thickness.

To realize strain compensation, it is in particular possible to select the relative ratio between the constituents of the constituent material and/or the thickness of at least one of the quantum wells such that the strain in at least one of the barrier layers is compensated by a strain in the essentially same amount as the strain of at least one barrier layer, but with an inverted sign.

In the quantum cascade laser structure in accordance with the invention, the cascade may comprise an injection zone, a extraction zone and an active zone arranged in-between said zones, where the actual emission of the laser radiation occurs, with each zone comprising at least one barrier layer and at least one of the barrier layers in the active zone and/or the injection zone comprising at least two constituent materials. If said barrier layer is the barrier layer of the active zone adjacent to the injection zone, i.e., the so-called injection barrier, quantum cascade lasers can be realized by appropriately engineering the thickness of the injection barrier and thus also the tunnel probability through the injection barrier, and said quantum cascade lasers can be operated optionally so as to emit laser radiation with multiple wave lengths (multiple wave length emission) or laser radiation with only one wave length (single wave length emission).

In the quantum cascade laser structure in accordance with the invention, not all barrier layers must comprise at least two constituent materials to achieve the aforementioned advantages. In one realization, the material of at least one of the barrier layers therefore has only one constituent material. In a modification of said realization, the constituent material of the barrier layers comprising only one constituent material is selected such that the conduction band discontinuity is maximized in the cascade. A large conduction band discontinuity is in particular advantageous if the laser is intended for use at room temperature.

The thicknesses and the constituents of the constituent materials of the quantum wells and the barrier layers as well as the composition of the material of at least one barrier layer having at least two constituent materials may be selected such in the quantum cascade laser structure in accordance with the invention that the laser wave length spectrum is 2.9 to 5.3 μm, preferably 3.5 to 4.5 μm, and in particular 3.7 to 4.2 μm. In addition to the detection of molecules, said wave length spectrum is also of significance for the transmission of communication, for collision monitoring radar systems, for automated steering systems, for medical diagnosis, for the target acquisition in the military as well as in the civilian area, and for the dazzling of infrared detectors and infrared cameras. With the proper selection of the temperature at which it is operated and/or the strength of the current flowing through the laser, the quantum cascade laser in accordance with the invention in particular facilitates the variation of the emission wave length within the stated range. A so-called external cavity or a different tuning strategy can also be used to engineer the wave length.

The following constituent materials, which include Al, As, Ga and In as constituents, are especially suitable for use in the quantum cascade laser structure in accordance with the invention:

$In_xGa_{1-x}As$ (indium-gallium-arsenide) with $0.6 \leq x \leq 1$, especially $In_{0.73}Ga_{0.27}As$ as constituent material of quantum wells $In_yAl_{1-y}As$ (indium-aluminum-arsenide) with $0.4 \leq y \leq 0.6$ and $In_zAl_{1-z}As$ with $0 \leq z \leq 0.4$, especially $In_{0.55}Al_{0.45}As$ and AlAs (aluminum arsenide) as constituent materials of at least one barrier layer with at least two constituent materials, and $In_sAl_{1-s}As$ with $0 \leq s \leq 0.4$, especially AlAs, as constituent material of the remaining barrier layers.

The constituent materials need not necessarily be present in pure form. Rather, they may also contain small amounts of other materials such as Sb (antimony) or P (phosphorus) in parts by molar composition of not more than approximately 5%. Even if $In_xGa_{1-x}As$, $In_{0.73}Ga_{0.27}As$, $In_yAl_{1-y}As$, $In_{0.55}Al_{0.45}As$, $In_zAl_{1-z}As$, AlAs or other constituent materials or materials are mentioned in the scope of this description, this is also always intended to comprise the case that said constituent materials and/or materials include small amounts of other constituents.

With the aforementioned constituent materials, it is in particular possible to obtain a very large conduction band discontinuity between the AlAs of the barriers and the InGaAs in the quantum wells, with a possible emission of laser radiation with a wave length between 2.9 and 5.3 μm, in particular between 3.5 and 4.5 μm and especially in a wave length between 3.8 and 4.2 μm, at room temperatures.

The thicknesses of the quantum wells and/or the thicknesses of the barrier layers and/or the composition of at least one barrier layer having two constituent materials may be selected such in the quantum cascade laser structure in accordance with the invention, in particular in the active zone of the structure, that the laser-active transition from a number of energetically closely adjacent higher conditions to energetically lower condition or into a number of energetically lower conditions and energetically closely adjacent conditions occurs so that multiple wave length emission occurs. In particular by varying the ratio of the $In_yAl_{1-y}As$ constituent material relative to the $In_zAl_{1-z}As$-constituent material in the injection barrier, the subband structure in the adjacent quantum well of the active zone, where the emission process occurs, can be engineered so that multiple wavelength emission as well as single wave length emission is possible.

Multiple wavelength emission can be obtained in particular if the injection barrier is less than approx. 4 to 5 nm thick, in particular less than 4.5 nm thick and especially less than 4 nm thick.

In the quantum cascade laser structure, a cascade may in particular have the following layers with the stated constituent materials and layer thicknesses in the stated order:

an $In_zAl_{1-z}As$-layer with $0 \leq z \leq 0.4$, in particular an AlAs layer with a thickness of 0.6 to 0.8 nm, in particular 0.75 nm;

an $In_xGa_{1-x}As$-layer with $0.6 \leq x \leq 1$, in particular an $In_{0.73}Ga_{0.27}As$ layer with a thickness of 3.2 to 3.6 nm, in particular 3.4 nm;

an $In_zAl_{1-z}As$ layer with $0 \leq x \leq 0.4$, in particular an AlAs layer with a thickness of 1.2 to 1.4 nm, in particular 1.3 nm;

an $In_xGa_{1-x}As$-layer with $0.6 \leq x \leq 1$, in particular an $In_{0.73}Ga_{0.27}As$-layer with a thickness of 2.8 to 3.2 nm, in particular 3.0 nm, and an n-doping;

an $In_zAl_{1-z}As$-layer with $0 \leq z \leq 0.4$, in particular an AlAs-layer with a thickness of 0.8 to 1.0 nm, in particular 0.9 nm;

an $In_xGa_{1-x}As$-layer with $0.6 \leq x \leq 1$, in particular an $In_{0.73}Ga_{0.27}As$-layer with a thickness of 2.4 to 2.8 nm, in particular 2.6 nm, and an n-doping;

an $In_zAl_{1-z}As$-layer with $0 \leq z \leq 0.4$, in particular an AlAs-layer with a thickness of 0.8 to 1.0 nm, in particular 0.9 nm;

an $In_xGa_{1-x}As$-layer with $0.6 \leq x \leq 1$, in particular an $In_{0.73}Ga_{0.27}As$-layer, with a thickness of 2.1 to 2.3 nm, in particular 2.2 nm, and an n-doping;

an $In_yAl_{1-y}As$-layer with $0.4 \leq y \leq 0.6$, in particular an $In_{0.55}Al_{0.45}As$-layer, with a thickness of 1.3 to 1.5 nm, in particular 1.4 nm, and an n-doping;

an $In_zAl_{1-z}As$-layer with $0 \leq z \leq 0.4$, in particular an AlAs-layer, with a thickness of 0.8 to 1.0 nm, in particular 0.9 nm;

an $In_xGa_{1-x}As$-layer with $0.6 \leq x \leq 1$, in particular an $In_{0.73}Ga_{0.27}As$-layer, with a thickness of 1.9 to 2.1 nm, in particular 2.0 nm;

an $In_yAl_{1-y}As$-layer with $0.4 \leq y \leq 0.6$, in particular an $In_{0.55}Al_{0.457}As$-layer, with a thickness of 1.3 to 1.5 nm, in particular 1.4 nm;

an $In_zAl_{1-z}As$-layer with $0 \leq z \leq 0.4$, in particular an AlAs-layer, with a thickness of 0.8 to 1.0 nm, in particular 0.9 nm;

an $In_xGa_{1-x}As$-layer with $0.6 \leq x \leq 1$, in particular an $In_{0.73}Ga_{0.27}As$-layer, with a thickness of 1.7 to 1.9 nm, in particular 1.8 nm;

an $In_yAl_{1-y}As$-layer with $0.4 \leq y \leq 0.6$, in particular an $In_{0.55}Al_{0.45}As$-layer, with a thickness of 2.8 to 3.2 nm, in particular 3.0 nm;

an In$_z$Al$_{1-z}$As-layer with $0 \leqq z \leqq 0.4$, in particular an AlAs-layer, with a thickness of 0.8 to 1.0 nm, in particular 0.9 nm;

an In$_x$Ga$_{1-x}$As-layer with $0.6 \leqq x \leqq 1$, in particular an In$_{0.73}$Ga$_{0.27}$As-layer, with a thickness of 1.7 to 1.9 nm, in particular 1.8 nm;

an In$_z$Al$_{1-z}$As-layer with $0 \leqq z \leqq 0.4$, in particular an AlAs-layer, with a thickness of 0.8 to 1.0 nm, in particular 0.9 nm;

an In$_x$Ga$_{1-x}$As-layer with $0.6 \leqq x \leqq 1$, in particular an In$_{0.73}$Ga$_{0.27}$As-layer, with a thickness of 4.7 to 5.3 nm, in particular 5.0 nm;

an In$_z$Al$_{1-z}$As-layer with $0 \leqq z \leqq 0.4$, in particular an AlAs-layer, with a thickness of 1.6 to 1.8 nm, in particular 1.7 nm;

an In$_x$Ga$_{1-x}$As-layer with $0.6 \leqq x \leqq 1$, in particular an In$_{0.73}$Ga$_{0.27}$As-layer, with a thickness of 4.0 to 4.4 nm, in particular 4.2 nm;

an In$_z$Al$_{1-z}$As-layer with $0 \leqq z \leqq 0.4$, in particular an AlAs-layer, with a thickness of 2.0 to 2.2 nm, in particular 2.1 nm;

an In$_x$Ga$_{1-x}$As-layer with $0.6 \leqq x \leqq 1$, in particular an In$_{0.73}$Ga$_{0.27}$As-layer, with a thickness of 3.6 to 4.0 nm, in particular 3.8 nm;

an In$_z$Al$_{1-z}$As-layer with $0 \leqq z \leqq 0.4$, in particular an AlAs-layer, with a thickness of 0.6 to 0.8 nm, in particular 0.75 nm.

For the n-doping, Si may be introduced into the respective layers, for example.

Instead of InAlAs and/or AlAs, the quantum cascade laser structure in accordance with the invention may comprise InAlAsSb (indium-aluminum-arsenic-antimony) or AlAsSb (aluminum-arsenic antimonide) as constituent material of at least one barrier layer with at least two constituent materials and/or as constituent material of the remaining barrier layers.

A quantum cascade laser in accordance with the invention comprises a lower waveguide layer, an upper waveguide layer and a quantum cascade laser structure in accordance with the invention arranged between said two waveguide layers. In particular, a quantum cascade laser in accordance with the invention may have a quantum cascade laser structure that can emit the laser radiation in several wave lengths and it may be equipped with a means to select the wave length of the emitted laser light. A potential means for selecting the wave length, for example, may be a so-called external cavity or a grating. A combination of external cavity and grating is also possible.

To dissipate the heat created in the operation of the quantum cascade laser, a quantum cascade laser in accordance with the invention may be connected to a heat sink, which may be realized, for example, as a so-called buried hetero structure or as a so-called epilayer-down mounting. By dissipating excess heat into the heat sink, the performance of the quantum cascade laser can be improved in particular in the operation at temperatures in the 300 K range.

Other characteristics, properties and advantages of the present invention are shown in the following in the description of a realization with reference to enclosed figures.

Figure 1:
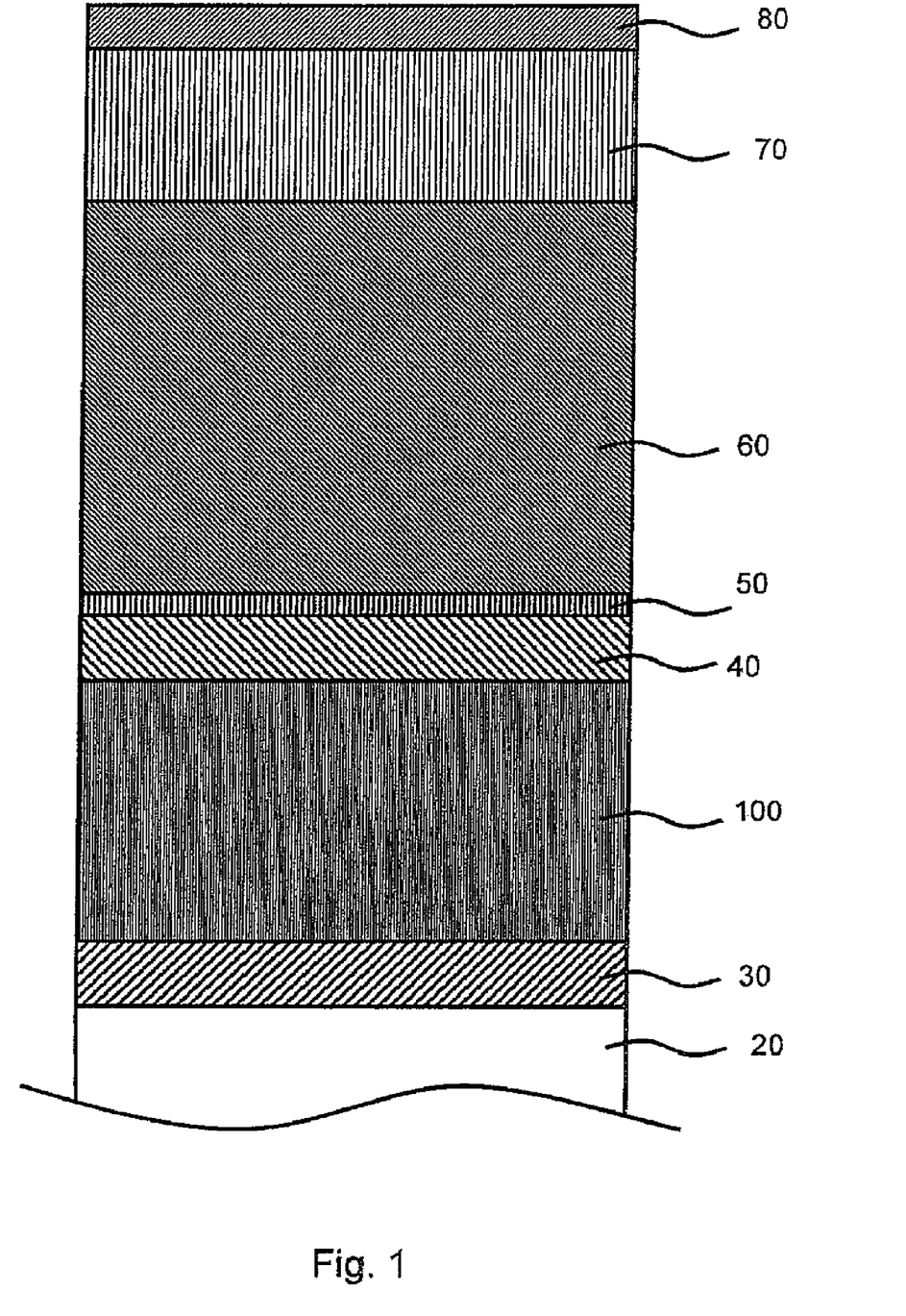
FIG. 1 shows an example of a quantum cascade laser in accordance with the invention in a schematic sectional view.

A quantum cascade laser 10 in accordance with the invention is shown schematically in FIG. 1 in a sectional view. The dimensions of the individual layers in FIG. 1 are not represented according to scale because the differences in the thicknesses of the individual layers are very large and therefore cannot be represented according to scale. The lateral dimensions of prototypes of the quantum cascade laser 10 produced so far are 1.5 mm×34 μm and/or 2.0 mm×28 μm and 2.0 mm×39 μm. However, the quantum cascade laser 10 can also be produced with other dimensions.

The quantum cascade laser described in the realization can be operated in particular such that it emits in a pulsed operating modus at 20° C. laser radiation in the wave length spectrum of approx. 3.8 to approx. 4.2 μm with a power output of over 240 mW per facet, i.e., in two different and in particular opposite radiation directions of the laser. If the quantum cascade laser is operated at low temperatures (8 K), a peak power output of up to 8 watts per facet can be obtained in the pulsed operating mode.

The quantum cascade laser 10 is produced in form of a vertical layer stack 11 from semiconductor materials and comprises a substrate 20, which simultaneously represents the lower cladding layer of the quantum cascade laser 10. In the present realization, the substrate 20 is comprised of InP (indium phosphide) and is doped with Sn (tin) in a concentration of $2 \times 10^{17}$ (doping means that atoms of another material, so-called foreign atoms or doping materials, are introduced into a semiconductor material in order to supply free electrons) and also functions as the lower electric contact of the laser.

The substrate 20 is topped by a lower waveguide layer 30 of In$_{0.52}$Ga$_{0.48}$As, which is doped with Si (silicon) in a concentration of $5 \times 10^{16}$ cm$^{-3}$. The lower waveguide layer 30 has a higher index of refraction than the substrate 20 and a thickness of 220 nm. Together with a second, upper waveguide layer 40, which is also made of In$_{0.52}$Ga$_{0.48}$As and has a silicon doping in a concentration of $5 \times 10^{16}$ cm$^{-3}$ and a thickness of 220 nm, said waveguide layer 30 confines the photons generated in the quantum cascade laser structure 100. The quantum cascade laser structure 100 has 30 cascades and a thickness of 1400 nm and is arranged between the two waveguide layers 30, 40. It will be described in detail later with reference to FIG. 2.

A so-called four-period graded superlattice 50, i.e., a layer where a lattice structure is superimposed on another lattice structure in a graded manner, caps the second waveguide layer. The superlattice 50 is produced of Si-doped In$_{0.52}$Ga$_{0.48}$As and Si-doped In$_{0.52}$Al$_{0.48}$As and has a thickness of 18 nm. Because of the different lattice constants of In$_{0.52}$Ga$_{0.48}$As and In$_{0.52}$Al$_{0.48}$As, the four-period superlattice 50 is formed in that the lattice positions of the two lattices render all four lattice periods congruent.

The superlattice 50 is followed by two top cladding layers 60, 70 with a total thickness of 3,300 nm, each of which is produced of InP and Si-doped, but with different Si concentrations. While the first top cladding layer 60 that directly follows the superlattice 50 has a thickness of 2,500 nm and a Si-concentration of $1 \times 10^{17}$, the thickness of the second top cladding layer 70 is 800 nm and its Si concentration is $4 \times 10^{18}$. Instead of InP, the top cladding layers 60, 70 may also be produced of other suitable materials, such as InAlAs or InGaAlAs (indium-gallium-aluminum-arsenide), for example.

The top layer of the quantum cascade laser 10 forms a contact layer 80 that is 130 nm thick and Si-doped with a concentration of $1 \times 10^{19}$ cm$^{-3}$ and forms the top electrical contact of the laser.

Figure 2:
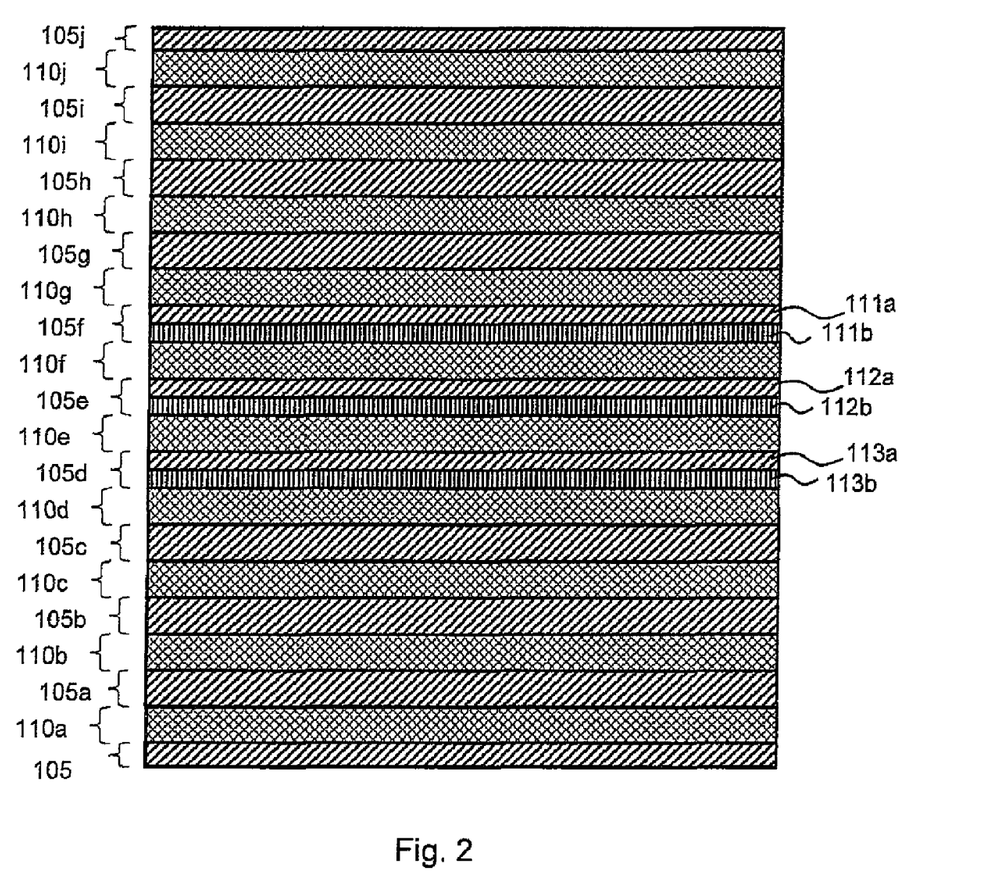
FIG. 2 shows a cascade of the quantum cascade laser structure of the laser in FIG. 1.

FIG. 2 shows a cascade of the quantum cascade laser structure 100 of FIG. 1 in detail. It comprises eleven barrier layers 105 to 105j as well as ten quantum wells 100a to 110j, each arranged between two barrier layers.

Each of the quantum wells 110a to 110j is produced of $In_{0.73}Ga_{0.27}As$ as the only constituent material, with the quantum wells 110b, 110c and 110d also being n-doped with a Si concentration of $5 \times 10^{17}$. The thicknesses of the quantum wells 110a to 110j are in a range of 1.8 to 5.0 nm and can be found in the table below. However, the quantum wells 110a to 110j may not fall below a specific minimum thickness so that the energy levels of the sub bands are not pushed out of the quantum well.

Each of the barrier layers 105a to 105c and 15g [TrNote: sic; 105g?] to 105j are produced of AlAs. Their thicknesses vary between 0.9 and 2.1 nm and are also listed in the table below. Unlike the barrier layers 105a to 105c and 15g to 105j, the barrier layers 105d, 105e and 105f are each comprised of two constituent materials, i.e., of AlAs as first constituent material 111a, 112a, 113a and $In_{0.55}Al_{0.45}As$ as second constituent material 111b, 112b, 113b. The constituent material 111b of the barrier layer 105d is also doped with Si in a concentration of $5 \times 10^{17}$.

| Reference Symbol | | Material | Doping substance | Doping substance concetration [cm$^{-3}$] | Thickness [nm] | |
|---|---|---|---|---|---|---|
| 105 | | AlAs | | | 0.75 | |
| 110a | | $In_{0.73}Ga_{0.27}As$ | | | 3.4 | |
| 105a | | AlAs | | | 1.3 | |
| 110b | | $In_{0.73}Ga_{0.27}As$ | Si | $5 \times 10^{17}$ | 3.0 | |
| 105b | | AlAs | | | 0.9 | |
| 110c | | $In_{0.73}Ga_{0.27}As$ | Si | $5 \times 10^{17}$ | 2.6 | |
| 105c | | AlAs | | | 0.9 | |
| 110d | | $In_{0.73}Ga_{0.27}As$ | Si | $5 \times 10^{17}$ | 2.2 | |
| 105d | 111b | $In_{0.55}Al_{0.45}As$ | Si | $5 \times 10^{17}$ | 2.3 | 1.4 |
| | 111a | AlAs | | | | 0.9 |
| 110e | | $In_{0.73}Ga_{0.27}As$ | | | 2.0 | |
| 105e | 112b | $In_{0.55}Al_{0.45}As$ | | | 2.3 | 1.4 |
| | 112a | AlAs | | | | 0.9 |
| 110f | | $In_{0.73}Ga_{0.27}As$ | | | 1.8 | |
| 105f | 113b | $In_{0.55}Al_{0.45}As$ | | | 3.9 | 3.0 |
| | 113a | AlAs | | | | 0.9 |
| 110g | | $In_{0.73}Ga_{0.27}As$ | | | 1.8 | |
| 105g | | AlAs | | | 0.9 | |
| 110h | | $In_{0.73}Ga_{0.27}As$ | | | 5.0 | |
| 105h | | AlAs | | | 1.7 | |
| 110i | | $In_{0.73}Ga_{0.27}As$ | | | 4.2 | |
| 105i | | AlAs | | | 2.1 | |
| 110j | | $In_{0.73}Ga_{0.27}As$ | | | 3.8 | |
| 105j | | AlAs | | | 0.75 | |

Figure 3:
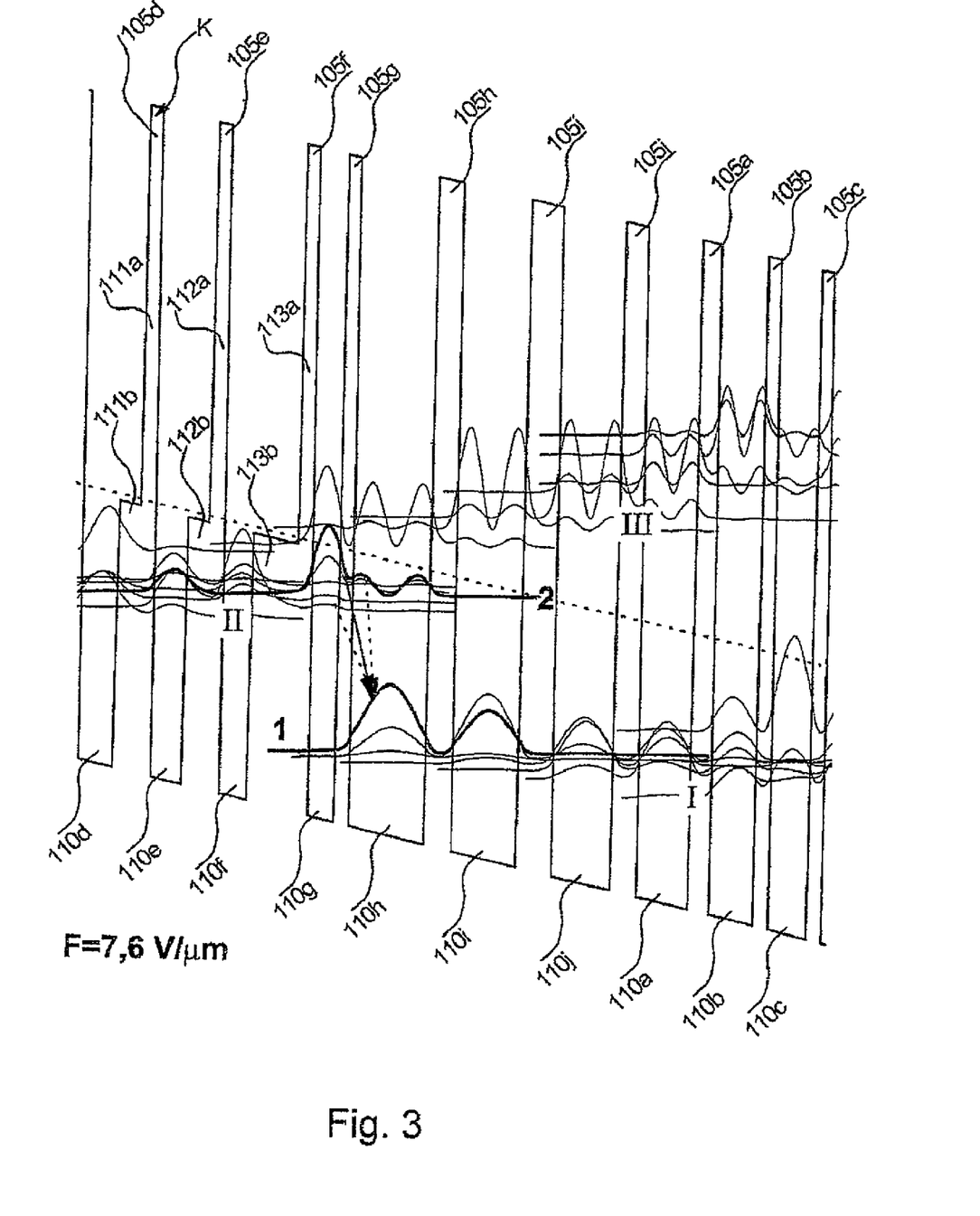
FIG. 3 shows the conduction band diagram of the cascade from FIG. 2.

The barrier layers 105a to 105c, 105i, 105j and quantum wells 110a to 110c, 110i, 110j form the so-called extraction zone, the barrier layers 105f to 105h and quantum wells 110g and 110h the so-called active zone and the barrier layers 105d and 105e and quantum wells 110d to 110f the so-called injection zone of the quantum cascade laser structure (see FIG. 3).

FIG. 3 shows the conduction band diagram of the cascade shown in FIG. 2 with an applied electric field of the field strength 7.6 V/µm. The conduction band diagram represents the energetic course of the conduction band edge K. The barrier layer 105j represents the border between two cascades, one of which is shown in FIG. 2. The segment of the conduction band diagram extending from the barrier layer 105j toward the left in FIG. 3 therefore belongs to a different cascade than the segment extending to the right in a representation as in FIG. 2. One half of the barrier layer 105j (thickness 1.5 nm) then belongs to the one cascade and the other half to the other cascade. In FIG. 2, the layer 105 corresponds to the one half and the layer 105j corresponds to the other half of the barrier layer 105j from FIG. 3.

In the quantum wells 110a to 110j, the conduction band edge K is energetically lower, whereas it is energetically higher in the barrier layers 105a to 105j. The use of AlAs in all barrier layers and InGaAs quantum wells maximizes the conduction band discontinuity, which reflects the energetic difference between conduction band edge K in the barrier layers 105a to 105j and the quantum wells 110a to 110j, in the entire cascade. When the quantum cascade laser structure is operated at room temperature, the large conduction band discontinuity in particular prevents electrons from overcoming the barrier layers 105a to 105j by having enough thermal energy to move unrestricted into the conduction band of the barrier material. Such transitions can lead to a so-called thermal depopulation of the energy level of a quantum well and as a result, the corresponding electrons are lost for the laser process. This thermal depopulation would inhibit a use of the laser at room temperature. Therefore, the large conduction band discontinuity of the quantum cascade laser structure in accordance with the invention makes it possible to emit laser radiation in a spectrum between 2.9 and 5.3 µm, especially in a spectrum of 3.5 and 4.5 µm and furthermore in particular in a spectrum of 3.7 to 4.2 µm at higher temperatures than would be possible with quantum cascade laser structures in accordance with the state of the art. In particular, the quantum cascade laser structure in accordance with the invention also allows an emission at room temperature.

FIG. 3 also shows the occupation probabilities of electrons in various energy levels, i.e., in an upper laser level 2, a lower laser level 1 as well as in additional energy levels that are grouped so closely together that each group can be considered an energy band, i.e., a so-called mini-band. The mini-bands are labeled I, II and III in FIG. 3. Electrons can be at one of the energy levels. They will be located mainly in the quantum wells 110a to 110j, but they can also tunnel through a barrier layer 105 to 105j from one quantum well 110a to 110j to the text. The probability of tunneling through a barrier layer 105a to 105j depends on the height as well as on the width of the layer.

Furthermore, the electrons can also transition from a higher energy level to a lower energy level. In doing so, they emit energy, for example in the form of photons, with the emitted energy corresponding to the energy difference between the two energy levels. In a transition of this type, i.e., in the transitioning from laser level 2 to laser level 1, the laser radiation is emitted. The wavelength of the emitted laser radiation is determined by the energy difference between the two laser levels 1, 2. Because said energy difference can be adjusted in particular by the width of the quantum wells 110g and 110h, the wavelength of the emitted laser radiation can be engineered in the production of the quantum cascade laser with the appropriate selection of said width. However, it is also possible to adjust the wave length of the emitted laser radiation in an already existing structure. The wavelength at which the emission of the laser radiation occurs can be varied, for example, with the appropriate adjustment of the temperature and/or the current strength of the current that flows through the quantum cascade laser and/or the electrical field.

Figure 4:
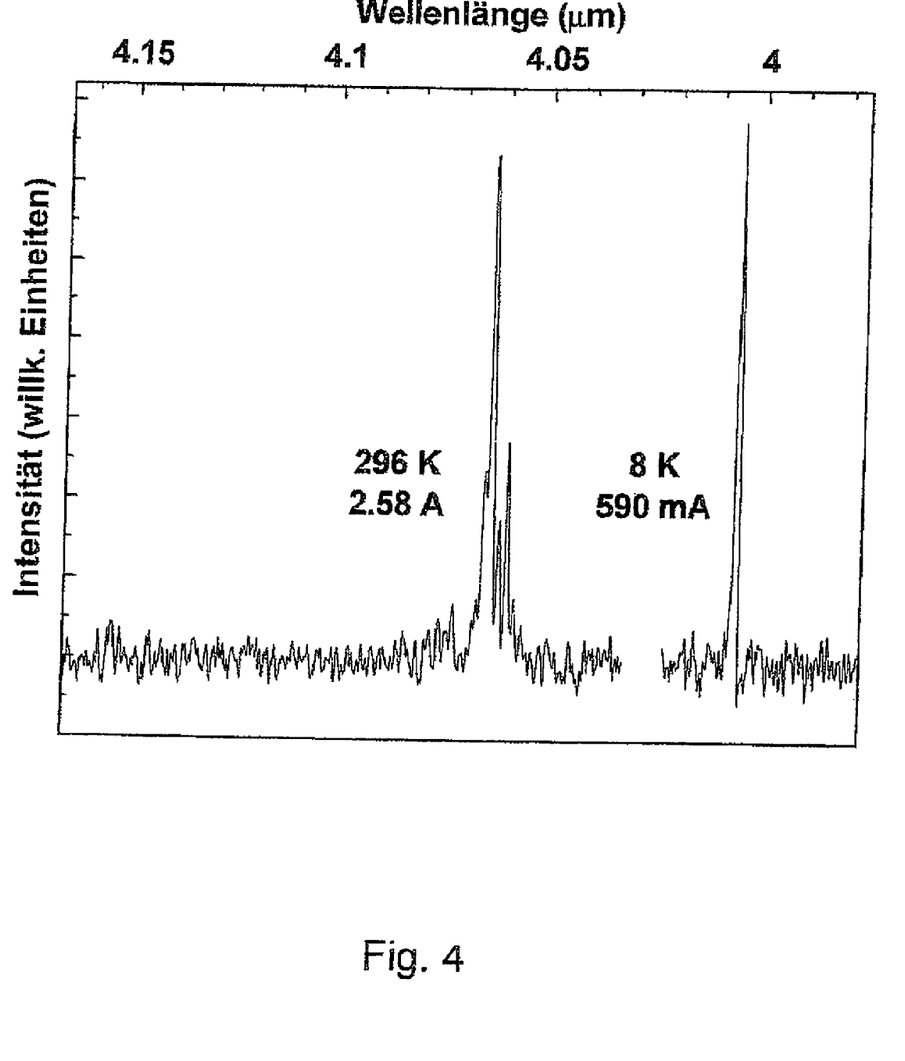
FIG. 4 shows a first emission spectrum of a quantum cascade laser with a quantum cascade laser structure as shown in FIGS. 2 and 3, at room temperature and at 8 K.

A prototype of the described quantum cascade laser structure with lateral dimensions of 1.5 nm×34 μm emitted laser radiation with a wave length of approx. 4.005 μm (see FIG. 4) at a temperature 8 K and a current density of 0.59 A, whereas said prototype emitted laser radiation with a wave length of 4.06 μm at a temperature of 296 K and a current density of 2.58 A. To record the spectra, the quantum cascade laser structure was operated with current pulses in a length of 100 ns and a repetition frequency of 5 KHz for the current pulses.

Also important for the emission of laser radiation is the degree of overlapping between the various energy levels of the mini-bands I and II and the laser levels 1 and/or 2 in the quantum wells 110g and 110h, which is linked closely to the tunnel probability. A high degree of overlapping means that a specific part of the laser radiation is not resulting from a transition from laser level to into laser level 1 but from a transition from one energy level of the mini-band II to the laser level 1 or in energy levels of the mini-band I. Likewise, in a large overlap, transitions from laser level 2 into an energy level of the mini-band I may occur. Because the energy levels of a mini-band differ slightly, the wave length of the laser radiation emitted at the corresponding transitions also differ slightly so that instead of radiation of a single wavelength, radiation in a wavelength spectrum is emitted. However, if the degree of overlapping between the various energy levels of the mini-bands I and II and the laser levels 1 and 2 in the quantum wells 110g and 110h is low, the transitions from one energy level of the mini-band II or into an energy level of the mini-band I are hardly significant in the emitting of the laser radiation and thus only laser radiation with a single wave length, which is determined by the energy difference between the laser level 2 and the laser level 1, is emitted.

In the quantum cascade laser structure in accordance with the invention, it is in particular possible to adjust the degree of overlapping between the various energy levels of the mini-bands I and II and the laser levels 1 and/or 2 in the quantum wells 110g and 110h by appropriately adjusting in particular the thickness of the barrier layer 105f, which forms the injection barrier of the quantum cascade laser structure, i.e., the barrier through which the electrons are "injected" into the active zone of the cascade, as well as the relative parts of the constituent materials 113a and 113b in the barrier layer 105f. Quantum cascade laser structures can be generated, which can be operated in multiple wave length emission modes as well as in single wave length emission mode. In particular thin barrier layers 105f as in the present realization are suitable for the production of quantum cascade lasers that can be operated in the multiple wave length emission modus.

Figure 5:
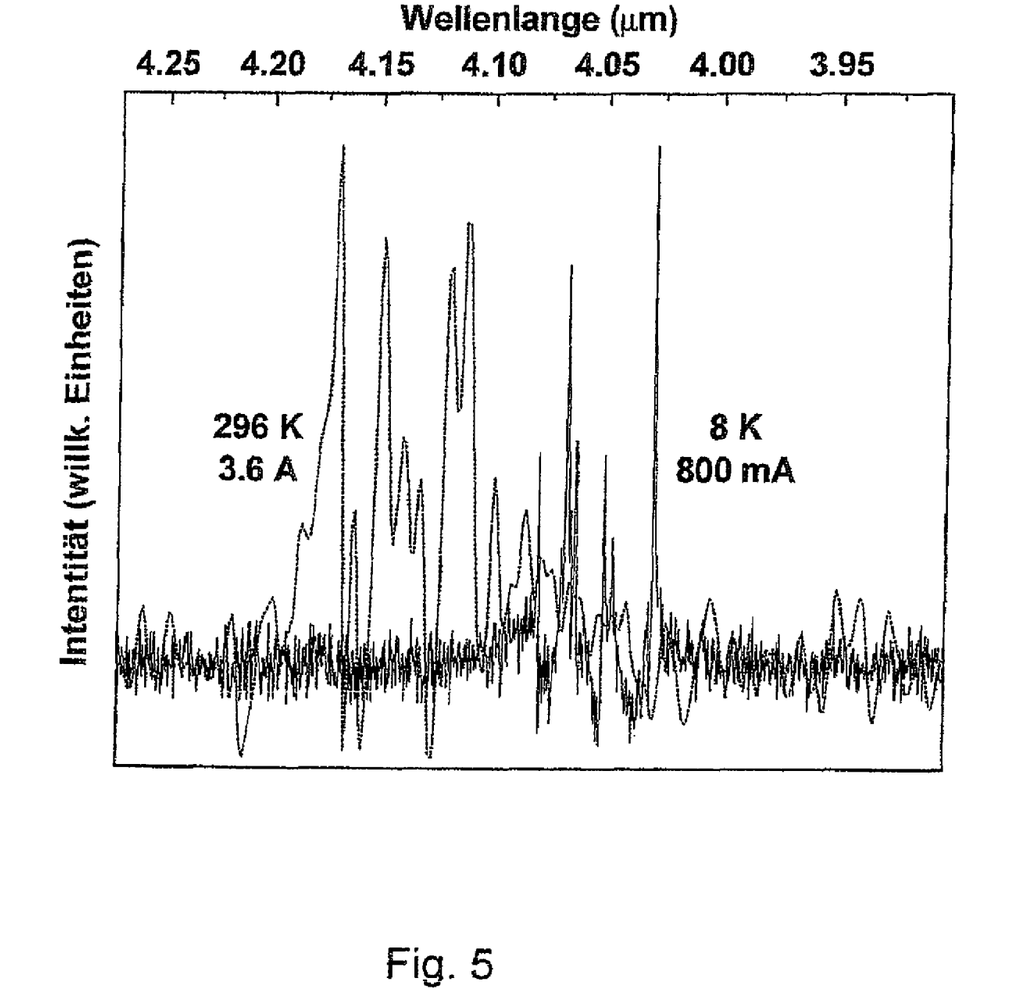
FIG. 5 shows a second emission spectrum of a quantum cascade laser with a quantum cascade laser structure as shown in FIGS. 2 and 3, at room temperature and at 8 K.

FIG. 5 shows the emission spectrum of a quantum cascade laser as described in the realization at multiple wave length emission. The laser has a length of 2.0 mm. If it is operated with a pulse frequency of 5 kHz and pulse duration of 100 ns at a temperature of 8 K, the emission of the laser radiation at various current strengths of the current flowing through the laser covers a wave length spectrum of 3.9 to 4.1 μm. The emission spectrum is shown at a current strength of 0.8 A, which shows an emission in a spectrum of 4.0 to 4.1 μm (continuous line). At a temperature of 296 K and a current strength of 3.6 A (dotted line), the emission spectrum reaches from approx. 4.0 to approx. 4.2 μm. If the quantum cascade laser structure in accordance with the invention is operated in multiple wave length emission modus, it can be operated in particular with a means for selecting the wave length of the emitted laser light, such as a grating or an extreme cavity, to enable the selection of a wave length from the emitted spectrum.

Some other experimentally determined performance data of the laser in accordance with the invention are described in the following with the FIGS. 6 to 8.

Figure 6:
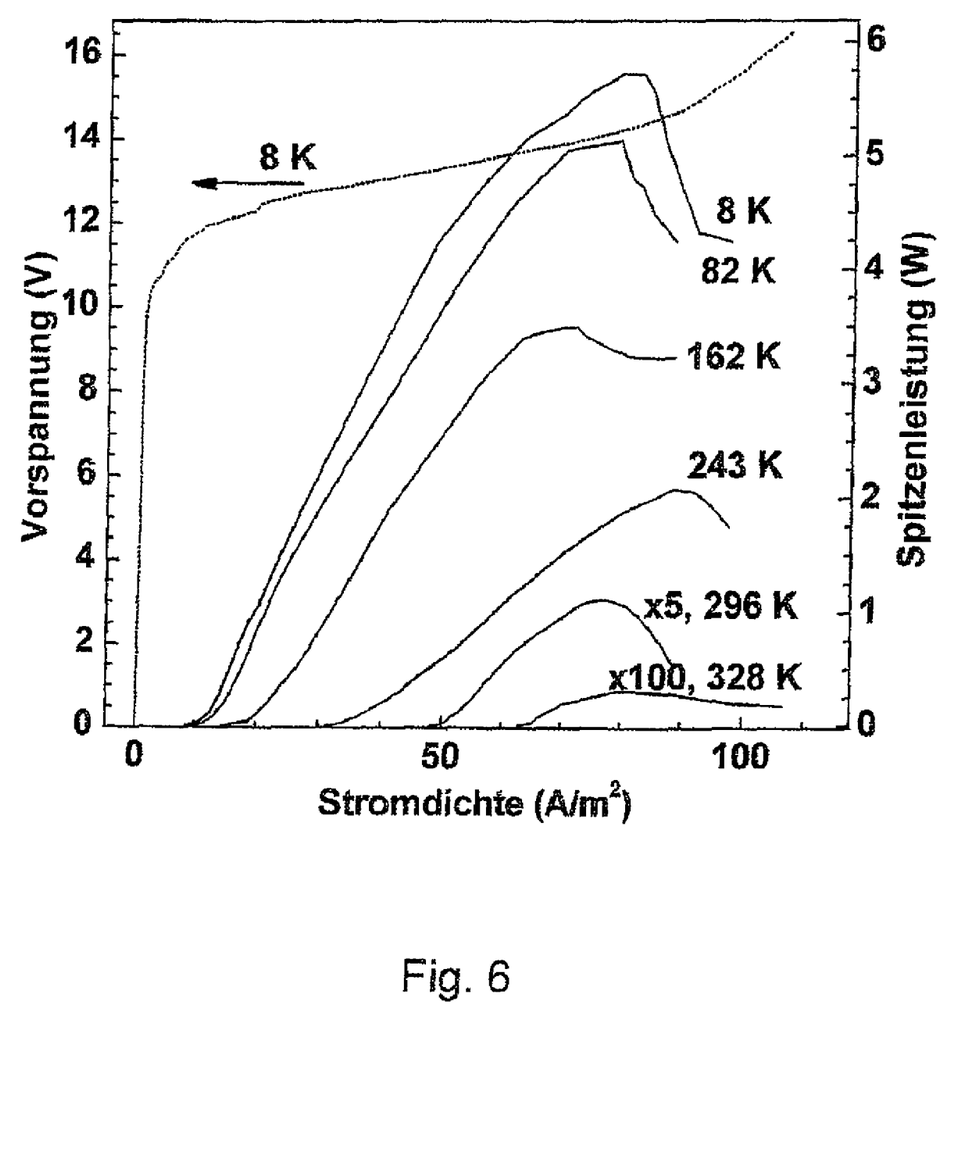
FIG. 6 shows the power output of a quantum cascade laser with a quantum cascade laser structure as shown in FIGS. 2 and 3 as a function of the pulsed current strength of the current flowing through the laser as well as the current density depending on the bias of the laser.
Figure 7:
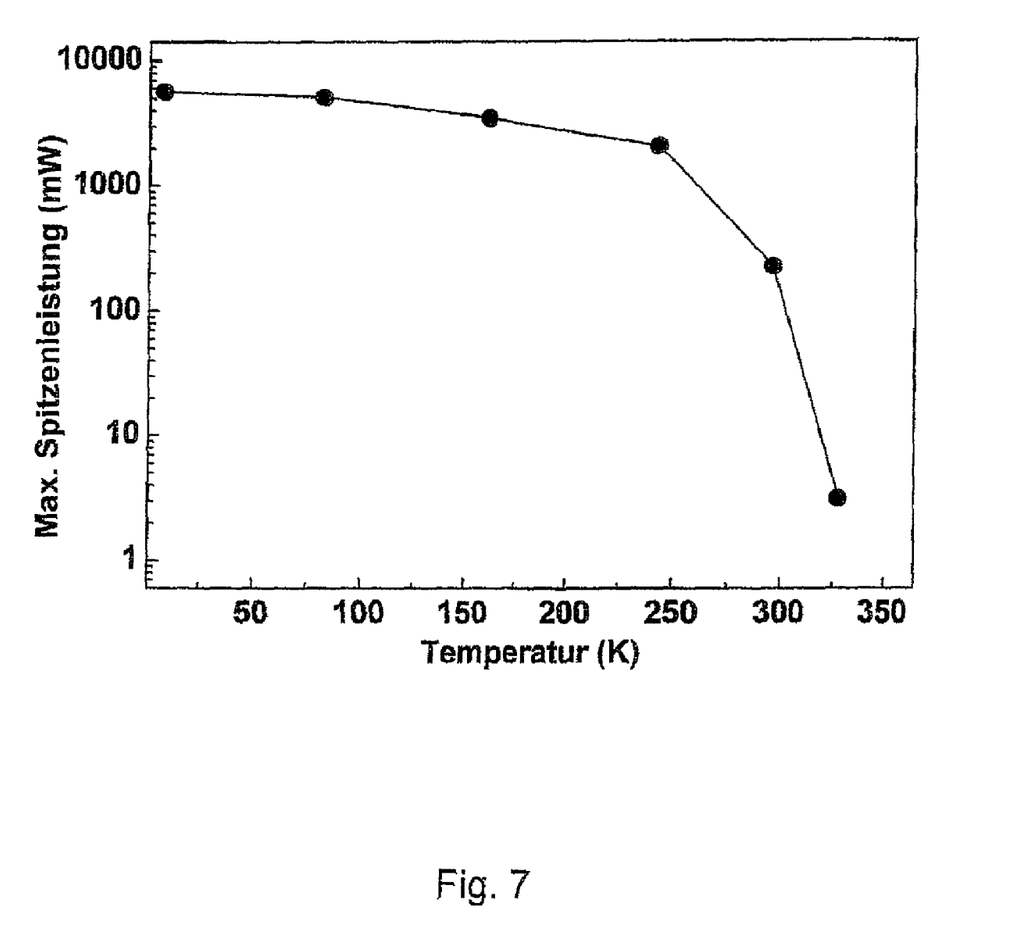
FIG. 7 shows the maximum peak performance of a quantum cascade laser with a quantum cascade laser structure as shown in FIGS. 2 and 3, as a function of the temperature at which the laser is operated.

The experimentally determined power output determined with a quantum cascade laser as described in the realization is shown in FIG. 6. The laser used in the experiment has lateral dimensions of 2.0 mm×28 μm. It was operated in pulsed mode, with the pulse frequency being 5 kHz and the pulse duration being 100 ns. In FIG. 6, the power values for 296 K are multiplied by a factor 5 and the power values at 328 K are multiplied by a factor 100 for better representation. The experimentally determined maximum power output line of the laser at 296 K (room temperature) occurs at a current strength of approx. 4.4 A and is 240 mW. The power output reached at room temperature is sufficient to detect and determine the concentration of gases, for example. In the quantum cascade laser structure in accordance with the invention, the measured power output of 240 mW per facet is already achieved without a highly developed heat sink. With the use of a heat sink, the power output of the laser at room temperature can therefore be increased even further. The high power output of the quantum cascade laser structure in accordance with the invention at room temperature is therefore based on the use of AlAs in the barrier layers 105-105j and the related large conduction band discontinuity, which prevents the thermal depopulation.

FIG. 6 shows that the maximum power output always occurs at a current density of 100 to 130 MA/m$^2$ (which corresponds to a total current of approx. 4 to 5 A) and increases as the temperature of the laser decreases. The dependency between the maximum power output and the temperature at which the laser is operated is shown by the logarithm in FIG. 7.

Also shown in FIG. 6 is the current-voltage curve (I-V curve) determined experimentally with the same laser, which shows the current density of the current flowing through the laser in dependence on the applied voltage. FIG. 6 shows the current-voltage curve at an operating temperature of the laser of 8 K.

Figure 8:
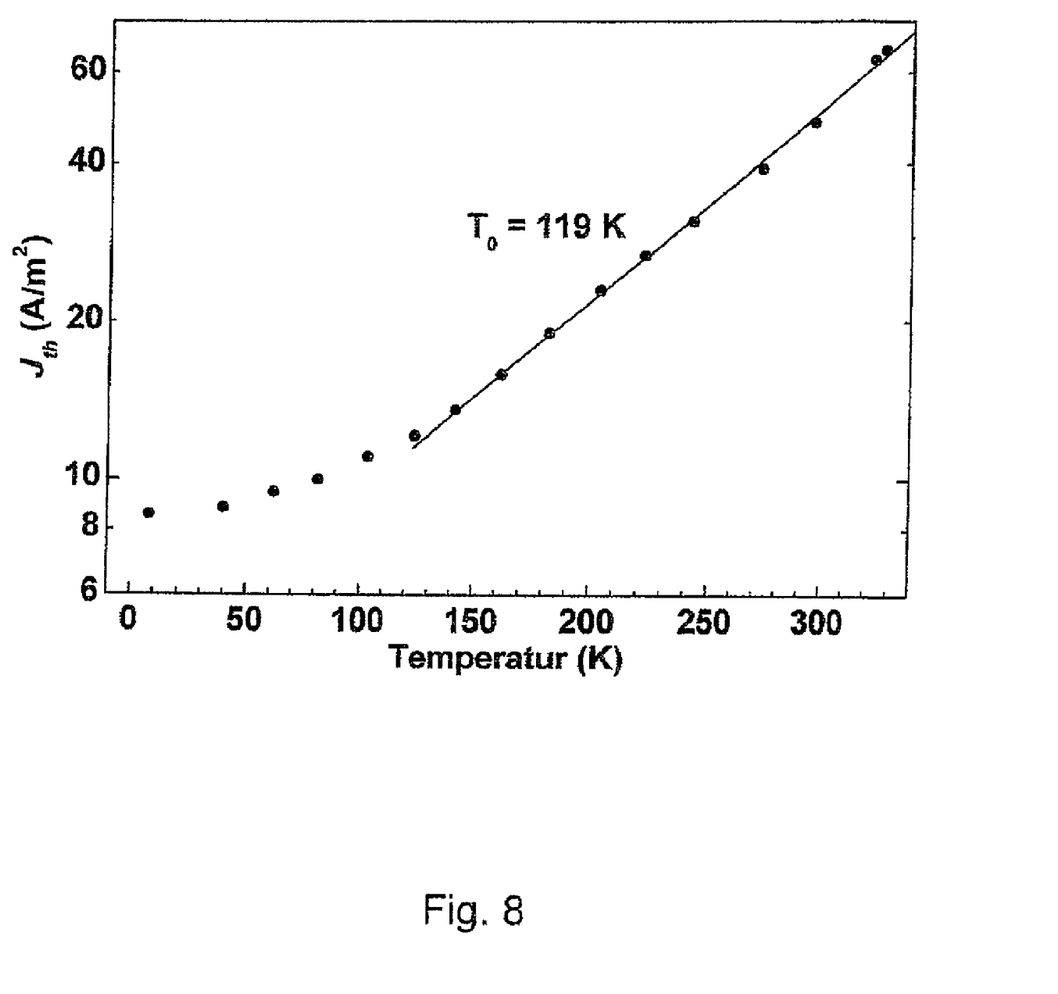
FIG. 8 shows the threshold current density $J_{th}$ of a quantum cascade lasers with a quantum cascade laser structure as shown in FIGS. 2 and 3, as a function of the temperature.

FIG. 8 shows the threshold current density $J_{th}$ as a function of the temperature for a quantum cascade laser in accordance with the invention with the quantum cascade laser structure described in the realization with lateral dimensions of 2.0 mm×28 μm, which was operated in the pulsed manner described above. The dashed line shows a curve adapted to the experimental data in a temperature range of 120 K to 328 K, which was used to determine the so-called characteristic temperature $T_o$ of the quantum cascade laser. 117 K was determined as the characteristic temperature $T_o$. The determined threshold current densities are lower than with the quantum cascade lasers in accordance with the state of the art, which emit in a spectrum between 3.0 and 5.0 μm, and are comparable to the best results of quantum cascade lasers with emission wave lengths that are slightly higher than 5.0 μm.

In the realization for the quantum cascade laser structure in accordance with the invention, the barrier layers are constructed with two constituent materials in such a manner that each of the constituent materials forms an independent partial layer. However, the two constituent materials can also be combined in other ways, for example to form a so-called superlattice pseudo alloy. Furthermore, the quantum cascade laser in accordance with the invention is not limited to the quantum cascade laser design described in the present realization. Rather, the quantum cascade laser structure in accordance with the invention can also be used in other quantum cascade laser designs. An overview of the various quantum cascade laser designs is shown in J. Faist et al., IEEE Journal of Quantum Electronics, Vol. 38, No. 6, July 2002.

The invention claimed is:

1. A quantum cascade laser structure having a number of cascades each of which comprises a number of alternately arranged quantum wells and barrier layers, at least one of said barrier layers having a layer constituent material with higher energy conduction band edge and a layer constituent material with lower energy conduction band edge, where the material of at least one quantum well is under mechanical strain,
the material of at least one of said higher energy conduction band edge barrier layer constituent material is under mechanical strain:
the quantum wells and the barrier layers are coordinated such that the existing mechanical strains are largely compensated within one cascade,
the material of at least one of the barrier layers comprises at least two layer constituent materials, and
the material of at least one other of the barrier layers has only one layer constituent material.

2. The quantum cascade laser structure of claim 1, wherein each of the layer constituent materials comprise a number of constituents and the composition of the layer constituent materials of the quantum wells and the barrier layers from the constituents and/or the thicknesses of the quantum wells ($110a$ to $110j$) and the barrier layers are coordinated such that existing mechanical strain is largely compensated within one cascade.

3. The quantum cascade laser structure of claim 2, where the relative ratio of the constituents of the layer constituent materials and/or the thickness of at least one of the quantum wells is selected such that and/or is such that the existing strain in at least one of the barrier layers is compensated by a mechanical strain in essentially the same quantity as the mechanical strain of at least one barrier layer, but with the opposite sign.

4. The quantum cascade laser structure of claim 1, where the cascade comprises an injection zone, a extraction zone and an active zone arranged between the injection zone and the extraction zone, with each zone comprising at least one barrier layer and at least one of the barrier layers in the active zone and/or in the injection zone having at least two layer constituent materials.

5. The quantum cascade laser structure of claim 4, where the barrier layer of the active zone which borders the injection zone has at least two layer constituent materials.

6. The quantum cascade laser structure of claim 1, with the constituent material of the at least one barrier layer is selected so as to maximize a conduction band discontinuity in the cascade.

7. The quantum cascade laser structure of claim 1, where the thicknesses and the constituents of the layer constituent materials of the quantum wells and the barrier layers as well as the composition of the material of at least one barrier layer with at least two layer constituent materials are selected so that a wave length spectrum of an emitted laser radiation is 2.9 to 5.3 μm.

8. The quantum cascade laser structure of claim 1, with $In_xGa_{1-x}As$ with $0.6 \leq x \leq 1$ as layer constituent material of the quantum wells;
$In_yAl_{1-y}As$ with $0.4 \leq y \leq 0.6$ and $In_zAl_{1-z}As$ with $0 \leq z \leq 0.4$ as layer constituent materials of at least one barrier layer with at least two layer constituent materials, and
$In_sAl_{1-s}As$ with $0 \leq s \leq 0.4$ as layer constituent material of the remaining barrier layers.

9. The quantum cascade laser structure of claim 8, with
$In_{0.73}Ga_{0.27}As$ as layer constituent material of the quantum wells,
$In_{0.55}Al_{0.45}As$ and AlAs as layer constituent materials of at least one barrier layer with at least two layer constituent materials and
AlAs as layer constituent material of the remaining barrier layers.

10. The quantum cascade laser structure of claim 4, characterized in that the thicknesses of the quantum wells and/or the thicknesses of the barrier layers and/or the composition of at least one barrier layer with at least two layer constituent materials is selected and/or is such in particular in the active zone that laser-active transition occurs from a number of energetically closely adjacent higher conditions (II) to an energetically lower condition (1) or a number of energetically lower and energetically closely adjacent conditions (I).

11. The quantum cascade laser structure of claim 10, wherein the barrier layer of the active zone which borders on the injection zone has a thickness of 5 nm or less.

12. A quantum cascade laser structure having a number of cascades each of which comprises a number of alternately arranged quantum wells and barrier layers, where
the material of at least one quantum well is under mechanical strain,
the material of at least one barrier layer is under mechanical strain:
the quantum wells and the barrier layers are coordinated such that the existing mechanical strains are largely compensated within one cascade,
the material of the quantum wells has only one constituent material each, and the material of at least one of the barrier layers comprises at least two constituent materials, wherein a cascade comprises the following layers with the stated constituent materials and layer thicknesses in the stated order:
an $In_zAl_{1-z}As$-layer with $0 \leq z \leq 0.4$, with a thickness of 0.6 to 0.8 nm;
an $In_xGa_{1-x}As$-layer with $0.6 \leq x \leq 1$, with a thickness of 3.2 to 3.6 nm;
an $In_zAl_{1-z}As$ layer with $0 \leq x \leq 0.4$, with a thickness of 1.2 to 1.4 nm;
an $In_xGa_{1-x}As$-layer with $0.6 \leq x \leq 1$, with a thickness of 2.8 to 3.2 nm, and an n-doping;
an $In_zAl_{1-z}As$-layer with $0 \leq z \leq 0.4$, with a thickness of 0.8 to 1.0 nm;
an $In_xGa_{1-x}As$-layer with $0.6 \leq x \leq 1$, with a thickness of 2.4 to 2.8 nm, and an n-doping;
an $In_zAl_{1-z}As$-layer with $0 \leq z \leq 0.4$, with a thickness of 0.8 to 1.0 nm;
an $In_xGa_{1-x}As$-layer with $0.6 \leq x \leq 1$, with a thickness of 2.1 to 2.3 nm, and an n-doping;
an $In_yAl_{1-y}As$-layer with $0.4 \leq y \leq 0.6$, with a thickness of 1.3 to 1.5 nm, and an n-doping;
an $In_zAl_{1-z}As$-layer with $0 \leq z \leq 0.4$, with a thickness of 0.8 to 1.0 nm;
an $In_xGa_{1-x}As$-layer with $0.6 \leq x \leq 1$, with a thickness of 1.9 to 2.1 nm;

an $In_yAl_{1-y}As$-layer with $0.4 \leq y \leq 0.6$, with a thickness of 1.3 to 1.5 nm;
an $In_zAl_{1-z}As$-layer with $0 \leq z \leq 0.4$, with a thickness of 0.8 to 1.0 nm;
an $In_xGa_{1-x}As$-layer with $0.6 \leq x \leq 1$, with a thickness of 1.7 to 1.9 nm;
an $In_yAl_{1-y}As$-layer with $0.4 \leq y \leq 0.6$, with a thickness of 2.8 to 3.2 nm;
an $In_zAl_{1-z}As$-layer with $0 \leq z \leq 0.4$, with a thickness of 0.8 to 1.0 nm;
an $In_xGa_{1-x}As$-layer with $0.6 \leq x \leq 1$, with a thickness of 1.7 to 1.9 nm;
an $In_zAl_{1-z}As$-layer with $0 \leq z \leq 0.4$, with a thickness of 0.8 to 1.0 nm;
an $In_xGa_{1-x}As$-layer with $0.6 \leq x \leq 1$, with a thickness of 4.7 to 5.3 nm;
an $In_zAl_{1-z}As$-layer with $0 \leq z \leq 0.4$, with a thickness of 1.6 to 1.8 nm;
an $In_xGa_{1-x}As$-layer with $0.6 \leq x \leq 1$, with a thickness of 4.0 to 4.4 nm;
an $In_zAl_{1-z}As$-layer with $0 \leq z \leq 0.4$, with a thickness of 2.0 to 2.2 nm;
an $In_xGa_{1-x}As$-layer with $0.6 \leq x \leq 1$, with a thickness of 3.6 to 4.0 nm;
an $In_zAl_{1-z}As$-layer with $0 \leq z \leq 0.4$, with a thickness of 0.6 to 0.8 nm.

13. The quantum cascade laser structure of claim 1, with InAlAsSb or AlAsSb as a first layer constituent material of at least one barrier layer having at least two layer constituent materials and/or with InAlAsSb in another composition than in the first constituent material as a second constituent material of at least one barrier layer with at least two constituent materials and/or with InAlAsSb or AlAsSb as constituent material of the remaining barrier layers.

14. A quantum cascade laser with a lower waveguide layer, an upper waveguide layer and the quantum cascade laser structure of claim 1 arranged between said two waveguide layers.

15. Quantum cascade laser in accordance with claim 14 having means for selecting the wave length of the emitted laser light.

16. Quantum cascade laser in accordance with claim 14, which is connected to a heat sink to dissipate heat generated in the operation of the laser.

17. Quantum cascade layer structure in accordance with claim 1, wherein at least one barrier layer is comprised of at least two layers of different layer constituent materials.

18. The quantum cascade laser structure of claim 12, wherein said cascade comprises the following layers with the stated constituent materials and layer thicknesses in the stated order:
an AlAs layer with a thickness of 0.75 nm;
an $In_{0.73}Ga_{0.27}As$ layer with a thickness of 3.4 nm;
an AlAs layer with a thickness of 1.3 nm;
an $In_{0.73}Ga_{0.27}As$-layer with a thickness of 3.0 nm, and an n-doping;
an AlAs-layer with a thickness of 0.9 nm;
an $In_{0.73}Ga_{0.27}As$-layer with a thickness of 2.6 nm, and an n-doping;
an AlAs-layer with a thickness of 0.9 nm;
an $In_{0.73}Ga_{0.27}As$-layer, with a thickness of 2.2 nm, and an n-doping;
an $In_{0.55}Al_{0.45}As$-layer with a thickness of 1.4 nm, and an n-doping;
an AlAs-layer, with a thickness of 0.9 nm;
an $In_{0.73}Ga_{0.27}As$-layer with a thickness of 2.0 nm;
an $In_{0.55}Al_{0.457}As$-layer with a thickness of 1.4 nm;
an AlAs-layer with a thickness of 0.9 nm;
an $In_{0.73}Ga_{0.27}As$-layer with a thickness of 1.8 nm;
an $In_{0.55}Al_{0.45}As$-layer with a thickness of 3.0 nm;
an AlAs-layer with a thickness of 0.9 nm;
an $In_{0.73}Ga_{0.27}As$-layer with a thickness of 1.8 nm;
an AlAs-layer with a thickness of 0.9 nm;
an $In_{0.73}Ga_{0.27}As$-layer with a thickness of 5.0 nm;
an AlAs-layer with a thickness of 1.7 nm;
an $In_{0.73}Ga_{0.27}As$-layer with a thickness of 4.2 nm;
an AlAs-layer, with a thickness of 2.1 nm;
an $In_{0.73}Ga_{0.27}As$-layer with a thickness of 3.8 nm;
an AlAs-layer with a thickness of 0.75 nm.

19. The quantum cascade laser structure of claim 1, wherein the barrier layers of the injection and active zones comprise layer constituent barrier layers consisting of two layer constituent materials and the barrier layers of the extraction zones comprise layer constituent barrier layers each consisting of one layer constituent material.

20. The quantum cascade laser structure of claim 1, wherein, in barrier layers comprising two layer constituent materials, each of said barrier layers comprising two layer constituent materials have higher and lower conduction band edges, wherein said higher conduction band edge is under mechanical strain.

* * * * *